(12) United States Patent
Shinomiya

(10) Patent No.: US 6,727,564 B2
(45) Date of Patent: Apr. 27, 2004

(54) SOLID IMAGE PICKUP APPARATUS

(75) Inventor: Kohji Shinomiya, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/210,077

(22) Filed: Aug. 2, 2002

(65) Prior Publication Data

US 2003/0173634 A1 Sep. 18, 2003

(30) Foreign Application Priority Data

Mar. 14, 2002 (JP) ........................................ 2002-070334

(51) Int. Cl.[7] .......................................... H01L 31/0232
(52) U.S. Cl. ...................................... 257/432; 257/431
(58) Field of Search ................................ 257/432, 684, 257/679, 59, 98, 911; 361/401; 438/48, 50

(56) References Cited

U.S. PATENT DOCUMENTS

| | | | |
|---|---|---|---|
| 4,634,884 A | | 1/1987 | Hayashimoto et al. |
| 5,172,304 A | * | 12/1992 | Ozawa et al. ............... 361/763 |
| 6,433,414 B2 | * | 8/2002 | Saito ......................... 257/684 |
| 6,444,487 B1 | * | 9/2002 | Boggs et al. ................. 438/48 |
| 6,476,417 B2 | * | 11/2002 | Honda et al. ................. 257/59 |
| 2001/0055073 A1 | | 12/2001 | Shinomiya |

FOREIGN PATENT DOCUMENTS

| | | |
|---|---|---|
| EP | 0 654 818 | 12/2000 |
| JP | 60-018958 | 1/1985 |
| JP | 61010374 | 1/1986 |
| JP | 7-095484 | 4/1995 |
| JP | 08009272 | 1/1996 |
| JP | 10-41492 | 2/1998 |
| JP | 11135361 | 5/1999 |
| JP | 11281996 | 10/1999 |
| JP | 2000049436 | 2/2000 |
| JP | 2001174841 | 6/2001 |

OTHER PUBLICATIONS

U.S. patent application Ser. No. 09/791,584, Shinomiya, filed Feb. 26, 2001.
U.S. patent application Ser. No. 09/799,690, Shinomiya et al., filed Mar. 7, 2001.
U.S. patent application Ser. No. 09/814,825, Shinomiya et al., filed Mar. 23, 2001.

* cited by examiner

*Primary Examiner*—Huan Hoang
*Assistant Examiner*—Thinh T Nguyen
(74) *Attorney, Agent, or Firm*—Leydig, Voit & Mayer, Ltd.

(57) ABSTRACT

A solid image pickup apparatus includes a flexible printed circuit board. A solid image pickup element and an optical lens held in a casing are disposed on the flexible printed circuit board. The flexible printed circuit board has a surface on which a capacitor is formed.

7 Claims, 5 Drawing Sheets

SOLID IMAGE PICKUP APPARATUS

FIELD OF THE INVENTION

This invention relates to a solid image pickup apparatus having a solid image pickup element and an optical lens disposed on a flexible printed circuit board.

BACKGROUND OF THE INVENTION

FIG. 10 shows a conventional solid image pickup apparatus. This solid image pickup apparatus comprises a solid image pickup element and an optical lens, with the solid image pickup element and an integrated circuit (IC) chip connected to a flexible printed circuit board. The reference numeral 1 denotes the flexible printed circuit board (FPC), 1a denotes an FPC lead section, and 2b denotes a reinforcing plate. The reference numeral 3 denotes a terminal provided on the flexible printed circuit board 1 for connecting the board to some other device, 4 denotes a fixed pedestal, 5 denotes a fixed cap, 13 denotes a casing, and 8 denotes a diaphragm.

FIG. 9 shows a cross-sectional view of the solid image pickup apparatus shown in FIG. 10. The fixed pedestal 4 is fixed to the FPC 1 via the reinforcing plate 2b while holding the optical filter 7. The fixed cap 5 is installed on the fixed pedestal 4 in a movable status for adjusting the diaphragm of the optical lens 6 while holding the optical lens 6. The fixed pedestal 4 and the fixed cap 5 constitute the casing 13 that holds the optical lens 6 and the optical filter 7. A solid image pickup element 9 is connected to the wiring of the FPC 1 via a flip-chip electrode connecting section 11. An IC 10 that performs image signal processing is connected to the wiring of the FPC 1 via the flip-chip electrode connecting section 11. A reinforcing plate 2a is adhered to the rear surface of the FPC 1 on the front surface of which the IC 10 is installed. A chip 12, such as a capacitor, is connected to the wiring of the FPC 1. The reference numeral 14 denotes an opening section of the FPC 1.

The operation of the solid image pickup apparatus shown in FIG. 9 and FIG. 10 will be explained next. Light that has entered the diaphragm section 8 passes through the optical lens. The light further passes through the optical filter 7, and irradiates an image pickup area of the solid image pickup element 9, thereby to form an image in this area. The information about this image is converted into an electric signal. This electric signal ("image pickup signal") is sent to the FPC 1 via the flip-chip electrode connecting section 11 of the solid image pickup element 9. Finally, the image pickup signal is sent to the IC 10 via the wiring of the FPC 1 and via the flip-chip electrode connecting section 11 of the IC 10. The electric signal is processed and sent back to the FPC 1 via the flip-chip electrode connecting section 11. The image pickup electric signal is taken out from the terminal 3 via the FPC lead section 1a of the FPC 1.

Usually, a large-scale integrated device (LSI) of a complementary metal-oxide semiconductor (CMOS) structure is mostly used for the solid image pickup element 9 and the IC 10. According to the LSI of the CMOS structure, when a metal-oxide semiconductor (MOS) transistor that constitutes the circuit has been switched on, a through current flows from a power source line to a ground line. This through current becomes a noise source, and noise passes through the power source inside the LSI and the ground wiring. This noise propagates in superimposition with the power source voltage, and appears between the power source terminal and the ground terminal of the LSI. The CMOS through current brings about mutual interference as noise between circuits inside the solid image pickup element 9, between circuits inside the IC 10, and between the solid image pickup element 9 and the IC 10, respectively. As a result, there occurs a phenomenon that the image pickup electric signal is degraded. Further, the noise also becomes a cause of an erroneous operation of other devices as EMI (Electromagnetic Interference).

Particularly when the LSI of the CMOS structure is used for the solid image pickup element 9, it is necessary to achieve further progress in fine processing in the LSI manufacturing to meet demand for increase in the number of pixels and demand for high image quality, along with a reduction in pixel sizes. Further, when the LSI of the CMOS structure is used for the IC 10, it is necessary to promote fine processing in the LSI manufacturing to further improve functions, reduce LSI chip sizes, lower costs, and increase the speed of circuit operation, along with the increase in circuit density. When fine processing in the LSI manufacturing progresses, the withstand voltage of the MOS transistor inevitably becomes low. Therefore, it becomes necessary to lower the power source voltage. This reduces the margin for restricting noise of the circuits. The reduction in the noise restriction margin becomes the cause of an erroneous operation due to noise from other devices as EMS (Electromagnetic Susceptibility).

In order to improve the speed of the circuit operation inside the LSI, there been an attempt to lower the resistance between the source and the drain of the CMOS transistors and carry out fast charging and discharging of the gate capacitance in the next-stage circuit. This shortens the rise time and the fall time of the through current in the switching operation. Further, a high-frequency component of the through current that flows from the power source line to the ground line increases, resulting in an increase in noise attributable to the through current.

In order to reduce the degrading of the image pickup electric signal due to the noise attributable to the through current, there has been made the following attempt. A capacitor is connected between the power source terminal and the ground terminal of each of the solid image pickup element 9 and the IC 10. The noise is bypassed through the capacitor, thereby to reduce the noise interference between the circuits inside the LSI, and reduce the noise interference between the solid image pickup element 9 and the IC 10. In order to minimize the sizes of the solid image pickup element, the chip 12 is usually used for these capacitors.

As the conventional solid image pickup apparatus has the above structure, a capacitor using the chip 12 is connected to the power source line of the solid image pickup element 9 and the IC 10 respectively in order to reduce the noise. The capacitor using the chip 12 is connected to a connection land and formed on the FPC 1 by soldering. Therefore, it is necessary to prevent other connection lands from being polluted due to the flying of the soldering flux and the flow of the solder wax on the wiring of the FPC 1 at the soldering time. Consequently, it has been necessary to set at least a predetermined distance (for example, a few mm) between the solid image pickup element 9 and the chip 12, and between the IC 10 and the chip 12, respectively.

In order to prevent the pollution of the connection land of the solid image pickup element 9 and the connection land of the IC 10 respectively due to the flying of flux and the flow of solder wax at the soldering time, it has been necessary to apply a provisional sealing to cover these connection lands before starting the soldering operation. After completing the soldering, the provisional sealing is removed, thereby to prevent the lands from being polluted. As space for applying the provisional sealing is necessary, it has been necessary to secure at least a predetermined distance (for example, a few mm) between the solid image pickup element 9 and the chip 12 and between the IC 10 and the chip 12 respectively on the FPC 1.

In order to prevent the fitting tool from colliding against the chip 12 at the time of fitting the solid image pickup element 9 and the IC 10 on the FPC 1, it has been necessary to secure a distance (for example, a few mm) between the solid image pickup element 9 and the chip 12 and between the IC 10 and the chip 12 respectively.

As explained above, it has been necessary to secure a distance between the solid image pickup element 9 and the chip 12 and between the IC 10 and the chip 12 respectively. Therefore, there has been a problem that the wiring resistance and the wiring inductance become large respectively depending on the length of the wiring of the FPC 1 due to the securing of the distance. The wiring resistance and the wiring inductance due to the securing of the distance are connected in series with the capacitors of the chip 12. Therefore, the characteristics of the capacitors are aggravated due to the increase in the wiring resistance and the wiring inductance respectively. This has a problem in that the high-frequency component among the AC components contained in the noise remains without being bypassed. This brings about a mutual interference due to the remaining noise between circuits inside the solid image pickup element 9, between circuits inside the IC 10, and between the solid image pickup element 9 and the IC 10, respectively. As a result, there occurs the above problem of degrading in the image pickup electric signal.

As it is necessary to secure a distance (for example, a few mm) between the solid image pickup element 9 and the chip 12 and between the IC 10 and the chip 12 respectively for the above reasons, this has had a difficulty in reducing the sizes of the solid image pickup apparatus.

As the chip 12 has a large shape, particularly, as the thickness of the chip 12 is larger than that of the solid image pickup element 9 and the IC 10 respectively, this has had a difficulty in reducing the sizes of the solid image pickup apparatus.

SUMMARY OF THE INVENTION

It is an object of the present invention to provide a solid image pickup apparatus that is compact and has no influence of noise.

The solid image pickup apparatus according to one aspect of the present invention comprises a flexible printed circuit board, having a surface, on which are disposed a solid image pickup element, and an optical lens held in a casing (5). Moreover, a capacitor is formed on the surface of the flexible printed circuit board.

The solid image pickup apparatus according to another aspect of the present invention comprises a flexible printed circuit board, having two surfaces, on which are disposed a solid image pickup element, and an optical lens held in a casing. Moreover, a capacitor having two electrodes, wherein one electrode of the capacitor is formed on one surface and the other electrode on the other surface of the flexible printed circuit board is provided.

Other objects and features of this invention will become apparent from the following description with reference to the accompanying drawings.

DETAILED DESCRIPTIONS

Embodiments of the solid image pickup apparatus according to this invention will be explained below with reference to the accompanying drawings.

Figure 1:
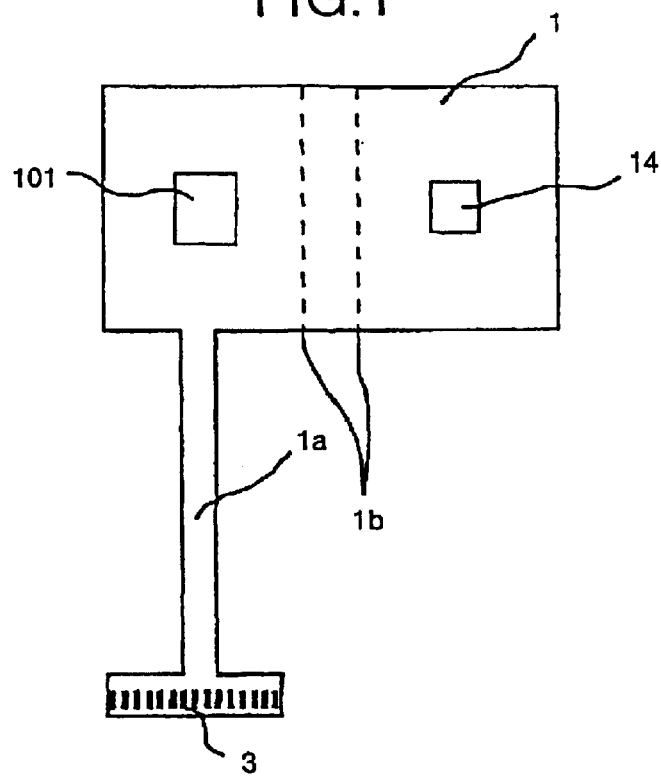
FIG. 1 is a developed view of an FPC in a first embodiment of this invention.

FIG. 1 shows a developed view of a flexible printed circuit board (hereinafter to be referred to as FPC) according to a first embodiment of this invention. The reference numeral 1 denotes an FPC prepared from a film material like polyimide. FIG. 1 shows the FPC in a developed status. Further, 1a denotes an FPC lead section, 1b denotes an FPC bending position, and 3 denotes an terminal provided at one end of the FPC 1. The reference numeral 14 denotes an opening section of the FPC 1, and 101 denotes a capacitor provided within the plane of the FPC 1.

Figure 2:
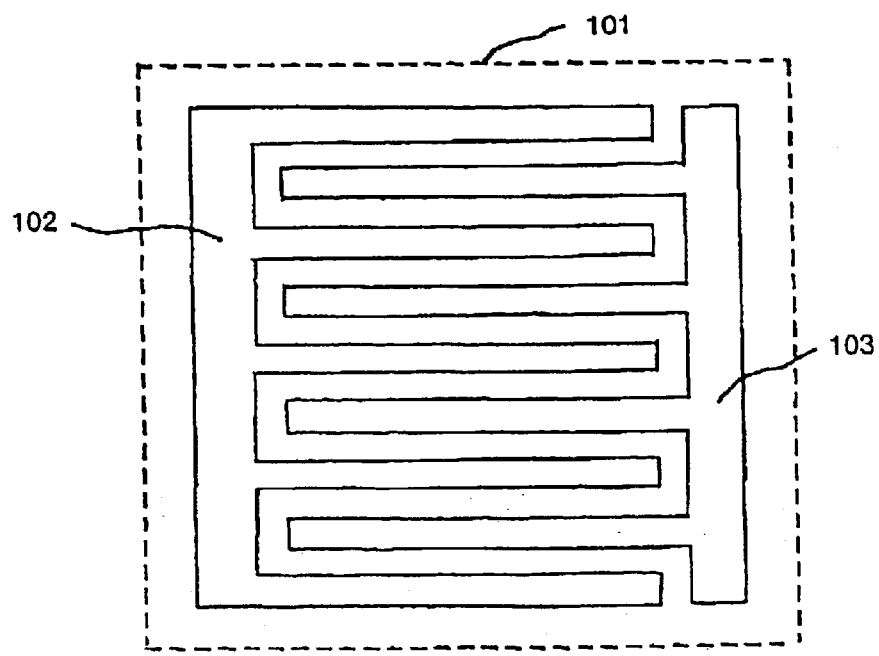
FIG. 2 is a top plan view of a capacitor 101 in the first embodiment of this invention.

FIG. 2 shows a plan of electrodes of the capacitor 101 according to this invention. The reference numeral 102 denotes a first electrode and 103 denotes a second electrode and constitute a pair of electrodes that are placed opposite to each other ("opposing electrodes"). These opposing electrodes are extended zigzag in plane directions to form a comb shape, thereby to take a large area of the electrodes. It is possible to prepare this comb shape in the process of etching a conductive material like copper foil provided in advance on the FPC 1.

Figure 3:
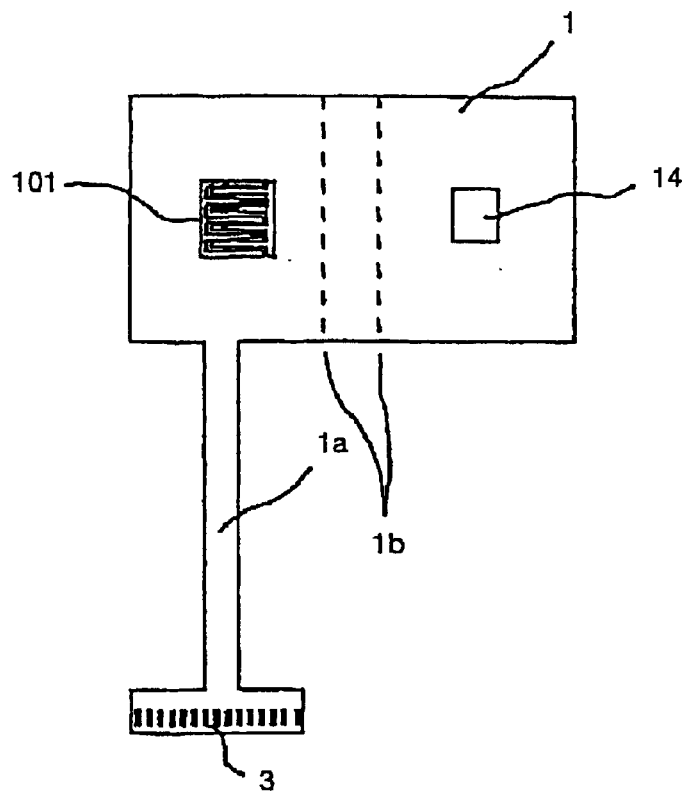
FIG. 3 is a developed view of the FPC in the first embodiment of this invention.

FIG. 3 is a developed view which shows the same FPC as that shown in FIG. 1 and FIG. 2. The capacitor 101 is formed within the plane of the FPC 1.

Figure 4:
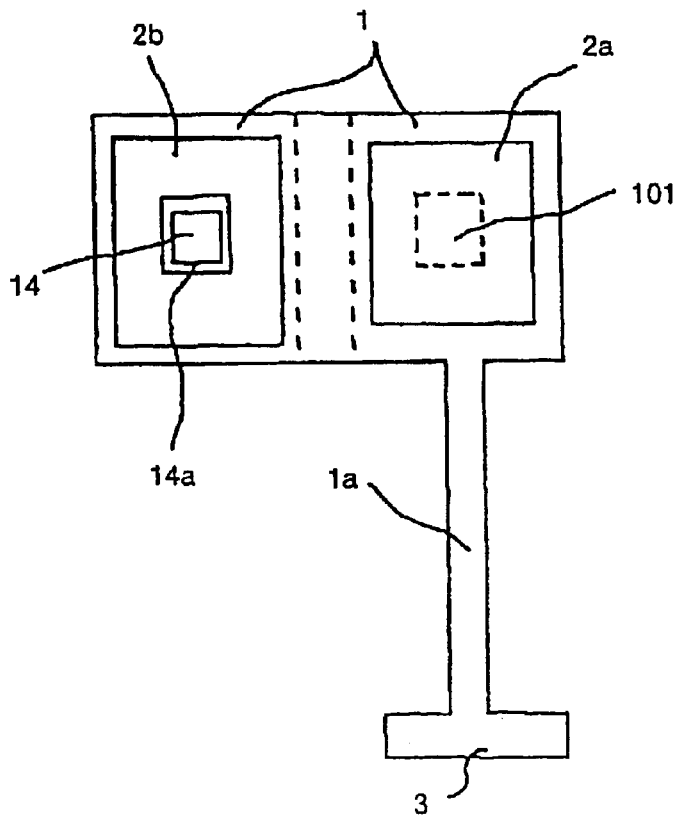
FIG. 4 is a developed view of the FPC in the first embodiment of this invention.

FIG. 4 is a developed view of the other side of the FPC shown in FIG. 3. This shows a status that a reinforcing plate 2a and a reinforcing plate 2b are adhered to the FPC 1. In FIG. 4, the reference numeral 14 denotes an opening section of the FPC 1, 14a denotes an opening section of the reinforcing plate, and 101 shows a status that the capacitor of this invention is disposed on the other side of FIG. 4.

Figure 5:
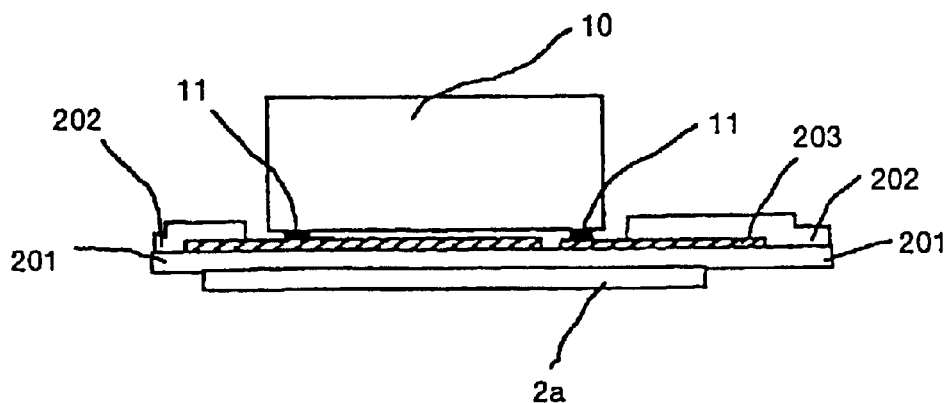
FIG. 5 is a cross-sectional view of the FPC in the first embodiment of this invention.

FIG. 5 shows a cross-sectional view of the FPC 1. The reference numeral 201 denotes a base film that uses a film material like polyimide. This shows one example of a base film using no adhesive. The reference numeral 203 denotes a copper foil, 202 denotes a cover lay film, 11 denotes a flip-chip electrode connecting section, 10 denotes an IC, and 2a denotes a reinforcing plate. The portions from 201 to 203 show a part of the FPC 1. The first electrode 102 and the second electrode 103 of the capacitor 101 are formed through the etching of the copper foil 203. The capacitor 101 and the IC 10 are structured on the same plane of the FPC 1.

Figure 6:
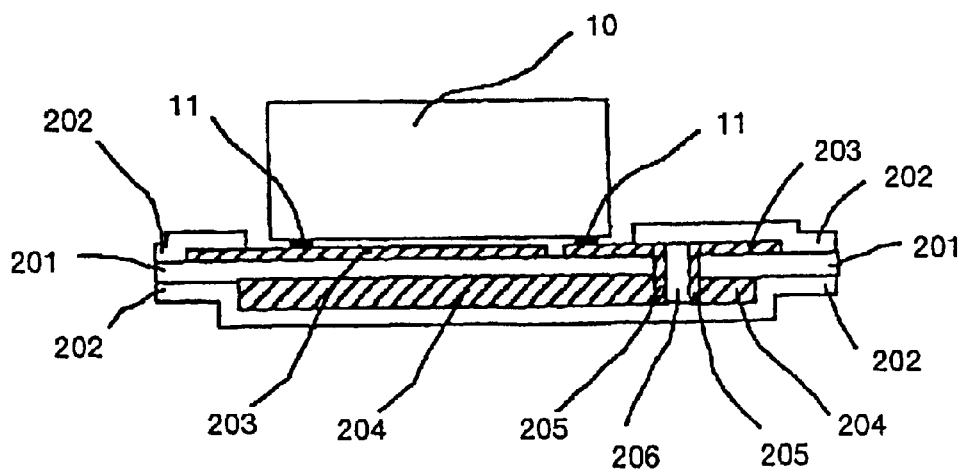
FIG. 6 is a developed view of the FPC in the first embodiment and a second embodiment of this invention.

FIG. 6 also shows a cross-sectional view of the FPC 1. The reference numeral 201 denotes a base film that uses a film material like polyimide. This shows one example of a base film using no adhesive. The reference numeral 203 denotes a copper foil, 204 denotes a conductor provided by plating nickel on copper foil, and 205 denotes a conductor provided within a through-hole. The reference numeral 206 denotes a through-hole, 202 denotes a cover lay film, 11 denotes a flip-chip electrode connecting section, and 10 denotes an IC. The portions from 201 to 206 show a part of the FPC 1. The first electrode 102 and the second electrode 103 of the capacitor 101 are formed using the conductor 204. With this arrangement, the IC 10 is structured on one plane of the FPC 1, and the capacitor 101 is structured on the other plane of the FPC 1.

The conductor 204 provided by having a hard metal like nickel plated on copper foil is used to reinforce the FPC 1 in the structure that omits the reinforcing plate 2a. The nickel plating may be omitted and only the copper foil may be used, when it is possible to perform the function of the capacitor 101.

As explained above, the solid image pickup apparatus using the capacitor 101 formed in this way can omit the chip. Therefore, this solid image pickup apparatus does not have the above problem generated at the time of soldering the chip. Further, as the capacitor can be formed at a position immediately close to the IC, it is possible to restrict the increase in the wiring inductance. Therefore, the solid image pickup apparatus exhibits satisfactory characteristics against the degrading of the image pickup electric signal.

While the two electrodes of the capacitor 101 are formed on the same plane of the FPC 1 in the first embodiment, it is also possible to form the two electrodes on both planes of the FPC 1 respectively. In other words, according to the second embodiment of the present invention, as shown in FIG. 6, it is also possible to form the capacitor by using the copper foil 203 as the first electrode, using the conductor 204 as the second electrode, and using the base film 201 as the insulation layer. In this instance, it is not necessary to form the first electrode and the second electrode of the capacitor 101 in the comb shape as shown in FIG. 2. It is possible to dispose the two electrodes on both sides of the FPC 1 at suitable and the same positions where other parts are not installed. In this embodiment, like in the first embodiment, the nickel plating may be omitted and only the copper foil may be used, when it is possible to perform the function of the capacitor 101.

As explained above, like in the first embodiment, the solid image pickup apparatus using the capacitor 101 formed in this way can omit the chip. Therefore, this solid image pickup apparatus does not have the above problem generated at the time of soldering the chip. Further, as the capacitor can be formed at a position immediately close to the IC, it is possible to restrict the increase in the wiring inductance. Therefore, the solid image pickup apparatus exhibits satisfactory characteristics against the degrading of the image pickup electric signal.

Figure 7:
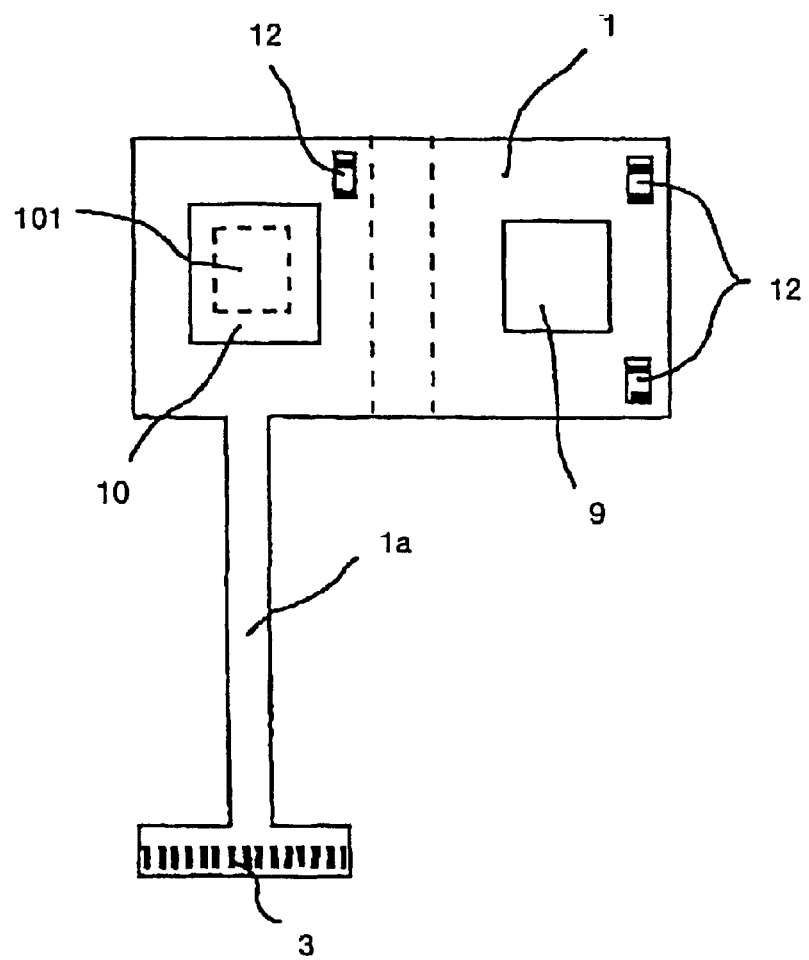
FIG. 7 is a developed view of an FPC in a third embodiment of this invention.
Figure 8:
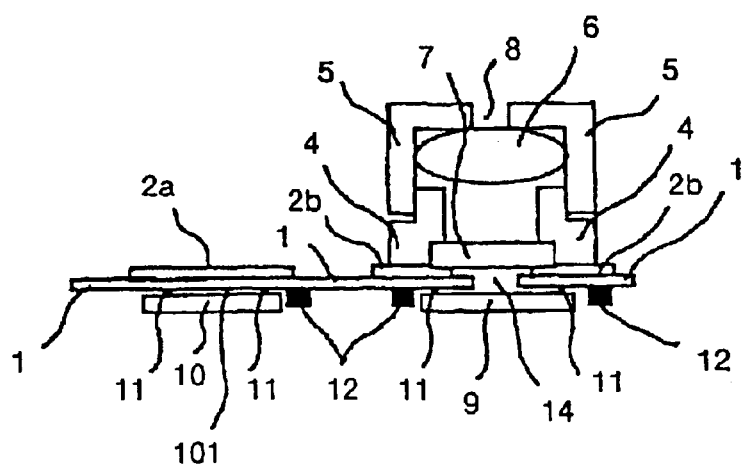
FIG. 8 is a cross-sectional view of the FPC in the third embodiment of this invention.
Figure 9:
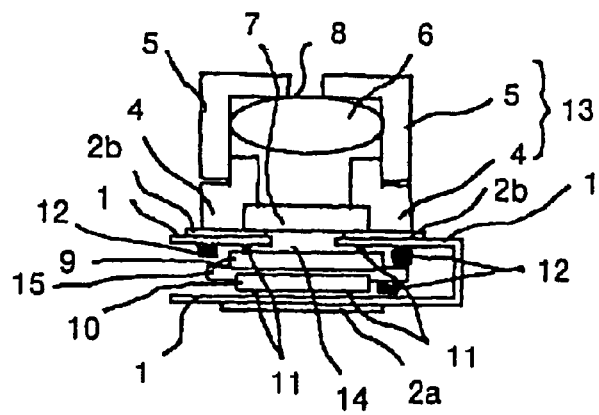
FIG. 9 is a cross-sectional view of a conventional FPC.
Figure 10:
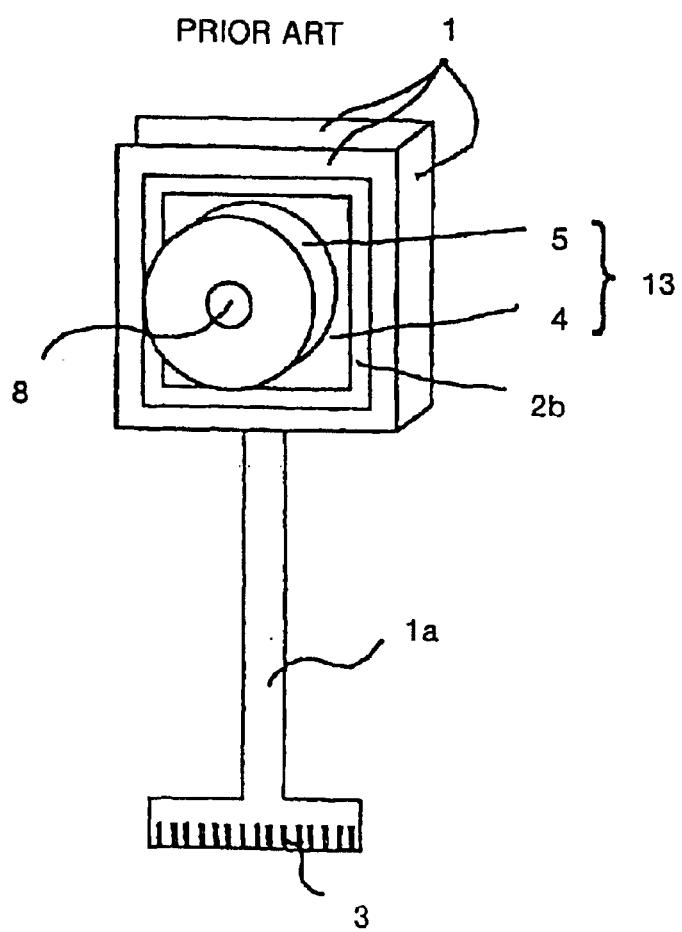
FIG. 10 is an appearance view of a conventional solid image pickup apparatus.

The third embodiment of this invention will be explained with reference to FIG. 7. The capacitor 101 is disposed beneath an IC 10, and a chip 12 is fitted to other part of an FPC 1. FIG. 8 is a cross-sectional view of the FPC shown in FIG. 7. The capacitor 101 is formed on the plane of the FPC 1 on which a flip-chip electrode 11 of the IC 10 is disposed.

According to the solid image pickup apparatus relating to the third embodiment this invention, the capacitor structured on the surface of the FPC 1 and the capacitor in the status of the chip are used together. Therefore, the capacitor 101 can be disposed relatively close to the IC 10 as explained above. Consequently, the wiring of the FPC 1 becomes short, and it is possible to make smaller the wiring resistance and the wiring inductance than those of the wiring of the chip 12.

By using both the capacitor 101 and the chip 12 (chip capacitor) of this invention, it is possible to change the chip 12 to a capacitor having a smaller electrostatic capacitance. Particularly, it is possible to employ the chip 12 having a small thickness. As a result, it is possible to reduce the sizes of the solid image pickup apparatus.

As explained above, according to the solid image pickup apparatus relating to this invention, as the capacitor built in the flexible printed circuit board is mounted on the solid image pickup apparatus, it is possible to omit the chip 12 (chip capacitor). Therefore, it is possible to obtain a compact solid image pickup apparatus.

As the capacitor is prepared using the conductive material and the insulating material in the flexible printed circuit board, it is possible to manufacture the solid image pickup apparatus without additionally using a new material and a new manufacturing process. Therefore, it is possible to realize a solid image pickup apparatus that can obtain an image pickup electric signal with little dynamic noise at low cost.

According to the solid image pickup apparatus relating to this invention, a hard metal plating (nickel plating or the like) is provided on the conductive material part (copper foil or the like) that forms a pair of opposing electrodes of the capacitor built in the flexible printed circuit board. With this arrangement, the hardness of the pair of opposing electrodes is increased, and the partial strength is increased by selectively making hard only the plane area of the flexible printed circuit board on which the IC is flip-chip connected. Therefore, it is possible to obtain a compact solid image pickup apparatus that can avoid the reinforcing plate 2a.

According to the solid image pickup apparatus relating to this invention, as the capacitor built in the flexible printed circuit board is mounted on the solid image pickup apparatus, it is possible to dispose the capacitor at a position closely near to the noise generation source. Therefore, it is possible to minimize the wiring resistance and the wiring inductance of the flexible printed circuit board. Consequently, it is possible to obtain a capacitor having a higher frequency characteristic than that of the chip capacitor of the conventional chip 12. It is possible to bypass particularly a high-frequency component among the AC components contained in the noise. It is possible to bypass the high-frequency component between circuits inside the IC mounted on the solid image pickup apparatus, and between the solid image pickup element and the IC mounted on the solid image pickup apparatus. Therefore, it is possible to realize a solid image pickup apparatus that can obtain an image pickup electric signal from which a high-frequency component of the through current noise of the CMOS transistor has been eliminated.

According to the solid image pickup apparatus relating to this invention, the capacitor built in the flexible printed circuit board and the capacitor of the chip 12 mounted on the solid image pickup apparatus are used together. Therefore, it is possible to change the chip capacitor of the chip 12 to a capacitor having a smaller electrostatic capacitance. Particularly, it is possible to employ the chip capacitor having a small thickness. Consequently, it is possible to reduce the sizes of the solid image pickup apparatus.

Further, it is possible to bypass the high-frequency component between circuits inside the IC mounted on the solid image pickup apparatus, and between the solid image pickup element and the IC mounted on the solid image pickup apparatus. Therefore, it is possible to realize a solid image pickup apparatus that can obtain an image pickup electric signal from which a high-frequency component of the through current noise of the CMOS transistor has been eliminated.

According to the solid image pickup apparatus relating to this invention, a pair of electrodes are formed in a comb shape using a conductive material and an insulating material in the flexible printed circuit board. Therefore, it is possible to manufacture a capacitor of a large electrostatic capacity in a small space, and it is possible to incorporate the capacitor in the flexible printed circuit board. Consequently, it is possible to realize a solid image pickup apparatus that can obtain an image pickup electric signal with less dynamic noise at low cost.

According to the solid image pickup apparatus relating to this invention, as the capacitor built in the flexible printed circuit board is mounted on the solid image pickup apparatus, it is possible to avoid the space of the chip capacitor or reduce the space. Therefore, it is possible to reduce the sizes of the solid image pickup apparatus. Further, it is possible to obtain the solid image pickup apparatus with increased strength against the EMI (Electromagnetic Interference) and the EMS (Electromagnetic Susceptibility).

According to the solid image pickup apparatus relating to this invention, the capacitor is prepared using the conductive material and the insulating material in the flexible printed circuit board. Therefore, it is possible to take a flexible shape of the solid image pickup apparatus to match the installation status of the solid image pickup apparatus. It is also possible to mount the solid image pickup apparatus on a compact case having a free design with good space efficiency.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A solid image pickup apparatus comprising:
    a flexible printed circuit board, having opposed first and second surfaces;
    a solid image pickup element disposed on the first surface on the flexible printed circuit board;
    an optical lens held in a casing and disposed on the second surface of the flexible printed circuit board; and
    first and second metal foils spaced from each other and disposed on the first surface of the flexible printed circuit board as plates of a capacitor.

2. The solid image pickup apparatus according to claim 1, wherein the first and second plates have comb shapes with interdigitated fingers.

3. The solid image pickup apparatus according to claim 1, wherein the first and second metal foils are plated with a metal harder than the first and second metal foils.

4. The solid image pickup apparatus according to claim 1, including an integrated circuit mounted on the second surface of the flexible printed circuit board.

5. The solid image pickup apparatus according to claim 1, including a reinforcing plate disposed on the first surface of the flexible printed circuit board opposite the plates of the capacitor.

6. The solid image pickup apparatus according to claim 3, wherein the first and second metal foils are copper and the metal harder than the first and second metal foils is nickel.

7. The solid state image pickup apparatus according to claim 1, wherein the first and second metal foils are disposed only on the first surface of the flexible printed circuit board.

* * * * *